(12) United States Patent
Herr et al.

(10) Patent No.: US 11,031,151 B2
(45) Date of Patent: Jun. 8, 2021

(54) AMPHIPHILIC HYBRID NANOMATERIALS

(71) Applicant: The University of North Carolina at Greensboro, Greensboro, NC (US)

(72) Inventors: Daniel J. C. Herr, Chapel Hill, NC (US); Hemali Rathnayake, Summerfield, NC (US); Kristen Dellinger, Brown Summitt, NC (US)

(73) Assignee: THE UNIVERSITY OF NORTH CAROLINA AT GREENSBORO, Greensboro, NC (US)

( * ) Notice: Subject to any disclaimer, the term of this patent is extended or adjusted under 35 U.S.C. 154(b) by 0 days.

(21) Appl. No.: 16/803,845

(22) Filed: Feb. 27, 2020

(65) Prior Publication Data
US 2020/0270275 A1    Aug. 27, 2020

Related U.S. Application Data

(60) Provisional application No. 62/811,292, filed on Feb. 27, 2019.

(51) Int. Cl.
| | |
|---|---|
| *H01B 1/22* | (2006.01) |
| *C07F 1/08* | (2006.01) |
| *H05K 1/09* | (2006.01) |
| *C09D 5/24* | (2006.01) |
| *C07F 15/04* | (2006.01) |
| *B22F 1/00* | (2006.01) |

(52) U.S. Cl.
CPC ............. *H01B 1/22* (2013.01); *B22F 1/0062* (2013.01); *C07F 1/08* (2013.01); *C07F 15/04* (2013.01); *C09D 5/24* (2013.01); *H05K 1/09* (2013.01); *H05K 1/092* (2013.01); *H05K 1/095* (2013.01); *H05K 1/097* (2013.01)

(58) Field of Classification Search
None
See application file for complete search history.

(56) References Cited

U.S. PATENT DOCUMENTS

| | | | | |
|---|---|---|---|---|
| 4,911,981 | A * | 3/1990 | Schnur ................. | A61K 9/1274 252/513 |
| 8,288,001 | B1 * | 10/2012 | Fan .......................... | B32B 5/16 428/402 |
| 2002/0139961 | A1 * | 10/2002 | Kinoshita ................ | H01B 1/12 252/500 |
| 2009/0011002 | A1 * | 1/2009 | Zabicky ............... | A61K 9/1272 424/450 |
| 2009/0087493 | A1 * | 4/2009 | Dai ...................... | A61K 9/0092 424/490 |
| 2011/0257253 | A1 * | 10/2011 | Seo ...................... | A61K 9/5115 514/449 |
| 2012/0034466 | A1 * | 2/2012 | Takeoka ................. | B82Y 30/00 428/411.1 |

(Continued)

*Primary Examiner* — Katie L. Hammer
(74) *Attorney, Agent, or Firm* — J. Clinton Wimbish; Nexsen Pruet, PLLC

(57) ABSTRACT

The devices and methods described herein push forward the resolution limits of directed self-assembly (DSA) technology for advanced device applications. Specifically described herein, are compositions of bioinspired DSA materials and methods using these bioinspired DSA materials to form sub-7 nm line-space patterns and to achieve functional nanoscopic structures, e.g., conducting nanowires on a substrate.

11 Claims, 10 Drawing Sheets

(56) References Cited

U.S. PATENT DOCUMENTS

2015/0129793 A1* 5/2015 Ruan .................... C09K 11/025
 252/62.54
2015/0316481 A1* 11/2015 Zamecnik ............ G01N 21/658
 435/7.2
2016/0200068 A1* 7/2016 Jung .................... H01L 51/444
 428/119

* cited by examiner

AMPHIPHILIC HYBRID NANOMATERIALS

RELATED APPLICATION DATA

The present application claims priority to U.S. Provisional Patent Application Ser. No. 62/811,292 filed Feb. 27, 2019 which is incorporated herein by reference in its entirety.

BACKGROUND

The manufacturable integration of geometric, equivalent and 3D scaling is driving Future Beyond CMOS devices and information processing technologies and systems. Additionally, interface control and low-energy functional patterning of non-traditional materials are enabling the integration of novel heterogeneous 3D materials and systems. The difficulty being faced by in current patterning technologies is resolution and defectivity, as well as line edge and interface roughness. Furthermore, the current resist-based patterning strategies require a subsequent pattern transfer step, which adds to the stochastic nature and variability of the patterning and pattern transfer process. These issues have made achieving low defect sub-10 nm pattern difficult using current technologies, and these challenges will only increase with each technology generations that require increasingly smaller patterns, such as sub-8 nm patterns.

SUMMARY

The devices and methods described herein push forward the resolution limits of directed self-assembly (DSA) technology for advanced device applications. Specifically described herein, are compositions of bioinspired DSA materials and methods using these bioinspired DSA materials to form sub-7 nm line-space patterns and to achieve functional nanoscopic structures, e.g., conducting nanowires on a substrate.

Utilizing intramolecular hydrophilic-hydrophobic interactions, as a driving force for self-assembly, systems and methods of fabricating molecular patterning platforms are described herein that leverage various metal cation-conjugates with bioinspired amphiphilic molecules. These systems and methods appear to exhibit a dynamic "Chi" during the assembly process. As described herein, sub 10 nm, sub 8 nm, sub 6 nm, sub 5 nm, sub 4 nm, an sub 3 nm ordered metal/organic line/space patterns are described, as well as conductivity through the metal nanowires. Methods and sub-4 nm functional self-assembly with the potential to serve as an inexpensive and effective way to pattern high-resolution features, such as for nanoelectronics, bioelectronics and other emerging $21^{ST}$ century information processing technologies.

In one aspect, a hybrid nanomaterial composition comprises an amphiphilic molecule comprising a polar head and a lipophilic tail; and a metal conjugated to the polar head of the amphiphilic molecule. The amphiphilic molecule can in some instances comprise one or both of a phospholipid, a multicarboxylated fatty acid, or any derivative thereof. In some cases, the amphiphilic molecule has photopolymerizable side chains.

In some embodiments, a metal described herein is an $M^{2+}$ cation. In some cases a metal described herein is a metal oxide. In some instances, a metal described herein is a copper or a nickel.

In some embodiments, a composition described herein self assembles to form line and/or space patterns of 10 nm, 8 nm, 6 nm, 5 nm, 4 nm, 3 nm, 2 nm, 1 nm, or less than 1 nm.

In some cases, a composition described herein assembles into atomic scale random patterns on solid substrates, the patterns comprising conductive metal oxide or metal nodes decorated on lamellar structures of lipid bilayers.

In another aspect, a method of fabricating a self-assembled functional nanostructure comprises dissolving a composition described herein in a first solvent to form a solubilized component; and mixing the solubilized component into a second solvent, wherein the composition is soluble in the first solvent and insoluble in the second solvent. In some cases, a self-assembled functional nanostructure comprises an inverse vesicle or micelle. In some instances, mixing the solubilized component into the second solvent is performed at approximately room temperature. In some embodiments, the self-assembled functional nanostructure self assembles as the solubilized component is mixed into the second solvent.

In some embodiments, a method described herein further comprises sonicating the solubilized component when mixing into the second solvent.

In one embodiment, the self-assembled functional nanostructure is a nanowire.

BRIEF DESCRIPTION OF THE FIGURES

FIGS. 2A-2D are transmission electron microscopy (TEM) images of: FIG. 2A—vesicles formed after adding the metal ion-chelated (phospholipid) PL solution into water; FIG. 2B—an irregular vesicle formed from $Cu^{+2}$ precursor and DPPC blend upon overnight aging in the freezer; FIG. 2C—SAED (selective area diffraction pattern) taken for the vesicle in FIG. 2B; and FIG. 2D—TEM image of homogeneously distributed copper nanoparticles formed from in-situ oxidation from a mixture of Cu+2/0PPC upon aging.

DETAILED DESCRIPTION

The initial set of candidate material systems considered included phase segregating block copolymers that incorporated linear polymeric blocks, such as functionalized carbon nanotubes, boron nitride nanotubes or other rigid linear block systems that show preferential etch resistance. It also considered other candidate families of block copolymers that incorporated 1D peptides or xeno nucleic acids (XNAL with designed lateral dimensions, as well as DNA-like origami, as templates for the pattern transfer process.

Figure 6:
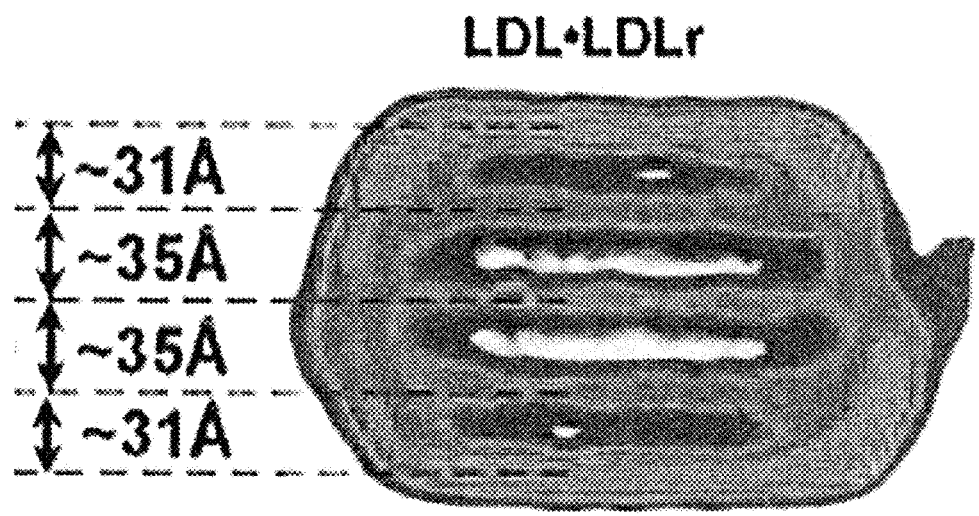
FIG. 6 is a structure of an LDL internal cholesterol ester core.
Figure 7:
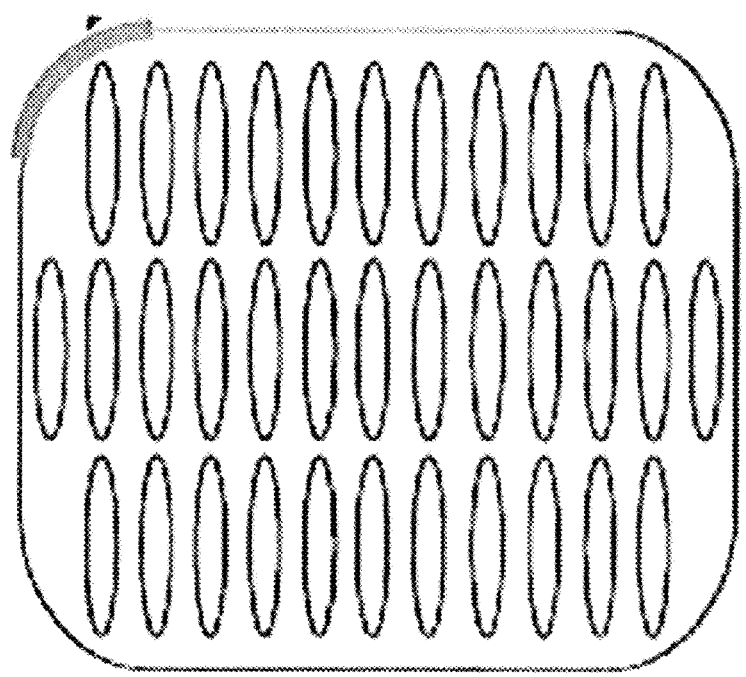
FIG. 7 is a schematic drawing of a tunable cholesterol ester alignment within an LDL structure.

Another interesting candidate system is inspired by the ordering of cholesterol esters within low-density lipoproteins. The cholesterol esters with low density lipoproteins (LDL) can exhibit a long range linear liquid crystalline structure, with a pitch of ~7.2 nm, as shown in FIG. 6, with internal structures that can be tuned to a smaller scale, as shown in FIG. 7. A further biomimetic approach is inspired by the crystalline nanostructure of other natural biomaterials, such as chitin or nano-cellulose. However, the corresponding phase segregation energies and selectivity of this initial set of nanomaterial families was not sufficient to achieve the desired sub-7 nm patterns, pattern transfer and functionality. Consequently, a new set of functionalized bioinspired, low cost nanomaterial analogs was needed that had desirable resolution, pattern transfer, and functional abilities. This disclosure describes such a set of functionalized bioinspired, low cost nanomaterial analogs with desirable resolution, pattern transfer, and functional abilities.

As described herein, directed assembly of molecular materials represents an emerging frontier that can enable the near deterministic patterning and fabrication of periodic and functional deep-nanoscale structures. A grand patterning challenge is to achieve near defect free fabrication of sub-10 nm 2D and 3D nanostructures. Current top-down techniques, e.g., argon-fluoride (ArF) immersion and extreme ultraviolet (EUV) lithography are expensive. While they may provide an engineering intensive solution for satisfying 7-nm logic node requirements, these techniques have proved to not be sufficiently capable to warrant insertion into the high-volume manufacturing flow of Beyond CMOS technologies. Directed self-assembly (DSA) of block copolymers (BCPs), combined with conventional lithography, has shown some promise as a low-cost alternative for pushing minimum feature sizes below 10 nm. While the directed self-assembly of block copolymers (BCP) represents the current state-of-the-art for bottom-up patterning of resist-like materials with various morphologies, resolution and defectivity issues have plagued their developments and limit their long-term applicability. For BCP technology, the minimum printable pitch generally depends more on the intrinsic phase segregation energy of the BCP material, rather than on the lithographic tool. Thus, a key challenge for BCP patterning lies in tuning the intrinsic interface energy between the blocks, which is governed by the volume fraction of each individual block (f), the number of repeating units (N), and the Flory-Huggins interaction parameter, Chi ($\chi$). For BCP based assembly to achieve ultimate resolution, i.e., <10 nm features, the final annealed and etched structures must exhibit optimal chemical incompatibility between blocks, i.e., high-$\chi$ and low-N, and etch selectivity. With respect to resolution, the pattern transfer of 5 nm structures has been reported by etching a block copolymer resist with 10 nm lamellar morphologies. However, designing BCP with these properties imposes a number of constraints, each of which need to be addressed. First high $\chi$ organic BCPs that can form sub-10 nm domains tend to suffer from low etch contrast between phases. Second, high $\chi$ systems tend to exhibit significant defectivity, as they tend to lock in local, versus global, energy minima that inhibits long-range order. Based on the current set of block-copolymeric materials considered by the patterning industry, i.e. block-copolymeric materials with limited and static phase segregation energies, the challenge of achieving low defect sub-10 nm self-assembled patterns is increasing with the introduction of each new technology generation.

As described herein, families of biologically based materials, such as fatty acids and lipids, can self-assemble into unusual and useful nano- and microstructures. The amphiphilic nature of these molecules, which are composed of a polar head group and a nonpolar hydrocarbon tail, holds the key for providing superior structural control. The opposing natures of the head and tail groups are analogous to those found in opposing blocks in the larger block co-polymers, such as PS-PMMA. For example, in phospholipids (PLs), the 0.7-1.0 nm hydrated hydrophilic head group and the hydrophobic tail, which ranges in length from 2.5-3.5 nm, provide unprecedented nanoscopic control over the structural complexity and functionality of a cell's lipid bilayer. For instance, most long-chain PLs self-assemble into spherical bilayer aggregates, known as liposomes. However, by exploiting the subtle interplay between appropriately modified head groups and corresponding fatty acid chains, certain synthetically modified phospholipids self-assemble into novel microstructures. One such example consists of a PL analog, with photopolymerizable diacetylenic moieties in the acyl chains, which self-assemble into hollow, cylindrical structures, known as tubules. Novel assemblies and structures also have been observed with other xenobiotic analogs, synthetic surfactants and in bile. Owing to these remarkable supramolecular assemblies, designed conjugates of bioinspired nanomaterials, consisting of lipid bilayers and inorganic nanomaterials, such as metal nanoparticles and nanocarbon, exhibit functional properties for novel electronic devices. In these devices, lipid bilayers serve as electrically insulating substrates that confine the nanomaterials, like insulation around a conducting wire. In some embodiments described herein, an array of nanoparticles can be separated with a uniform and tunable gap distance using supramolecular design principles. By controlling the separation distance between atoms, functional moieties, molecules, nanoparticles or arrays with nanoscale precision using selective molecular interactions of lipids, many variations in the size, composition and shape of the self-assembled nanostructures are possible. Additionally described herein, is that lipids can alter the dielectric properties of metallic nanoparticles, providing a way to modulate the optical properties of an integrated architecture, and can, in some instances, serve as optical sensors. Further described herein is that the lipid and nanoparticle interactions can be adjusted and tuned by altering the nature of the polar head groups.

Although these types of hybrid bioinspired nanomaterial self-assemblies hold great promise in sensing, stabilization of reactive nanomaterials, information processing and drug delivery, the ability to sufficiently control the overall size, long range order and functionality of an assembled structure at the nanometer scale presents a significant technical challenge. For semiconductor related DSA technologies, this challenge is intimately tied to the directed self-assembly of block copolymers, which appear to exhibit a limiting minimal domain dimension of ~10 nm.

In embodiments described herein, methods of achieving precisely controlled, conjugated metal/metal oxide PL assemblies that form random sets of ~3 nm line/space patterns, with an intermediate range order of ~150 nm. The near room temperature self-assembly process, described herein, is simple and provides a very attractive and novel starting point for using bioinspired molecules to address the structural control challenge in the fabrication of self-assembled functional nanostructures. For example, designed functional nanomaterials and bioinspired molecular components can be incorporated within a precursor PL bilayer that enables one-pot, in situ synthesis, rather than requiring encapsulation of the nanomaterials directly into the lipid bilayer.

In an aspect, hybrid nanomaterial compositions comprising conductive metal oxide nodes decorated lamellar structures of lipid bilayers are described herein, and these compositions are used to obtain atomic scale random patterns on solid substrates. Through tailoring the self-assembly conditions, near atomic scale patterned platforms are fabricated and formed from copper and nickel ion chelated functional PL derivatives. The application of supramolecular principles to prepare these virtually untapped bioinspired nanomaterials allows for patterning, functional diversification, biodevice platforms, and biocompatible membranes, e.g., supported lipid bilayers in some cases. For example, platforms described herein can be applied in some instances to: (1) single-electron transistors (SETs) that exhibit circuit-reconstruction and adaptability through the lipid bilayer-like membranes, (2) plasmonic devices that incorporate metal nanoparticle arrays, and (3) bioinspired switches that express hybridized functions, based on designed combinations of artificial cell membranes, as electrically insulating layers, and conductive metal islands.

Figure 1:
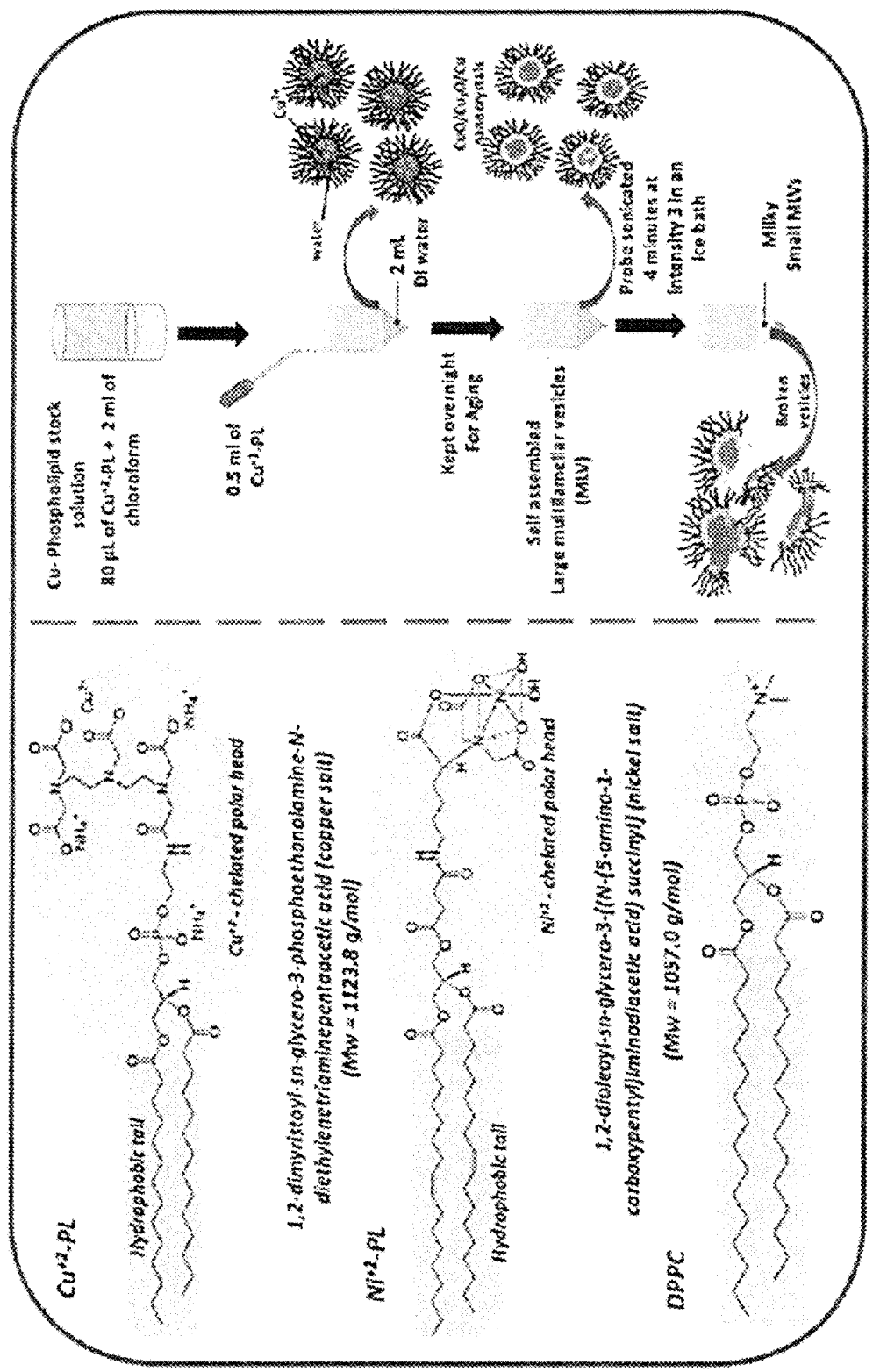
FIG. 1 is a schematic representation, where the left side shows chemical structures of each metal-ion conjugated PL derivatives and 1,2-dipalmitoyl-sn-glycero-3-phosphocholine (DPPC), and the right side shows a preparation of nanoassemblies and the solvent polarity driven predicted mechanism for inverse vesicle formation.
Figure 2A:
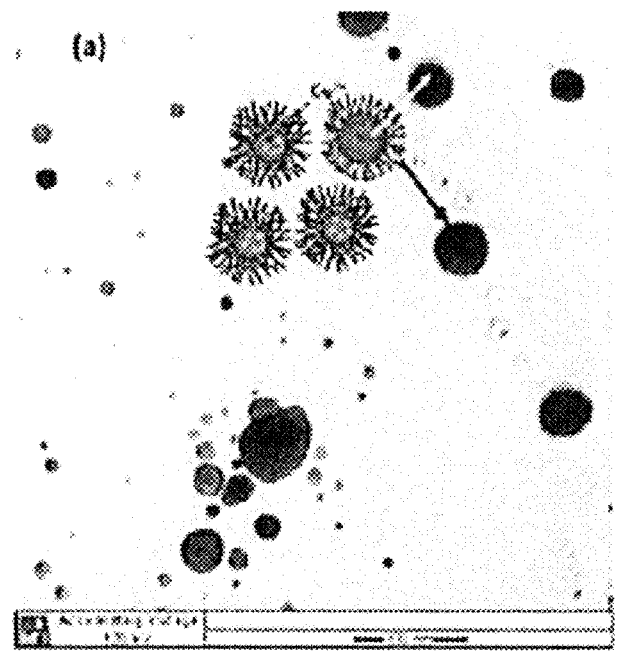
Figure 2B:
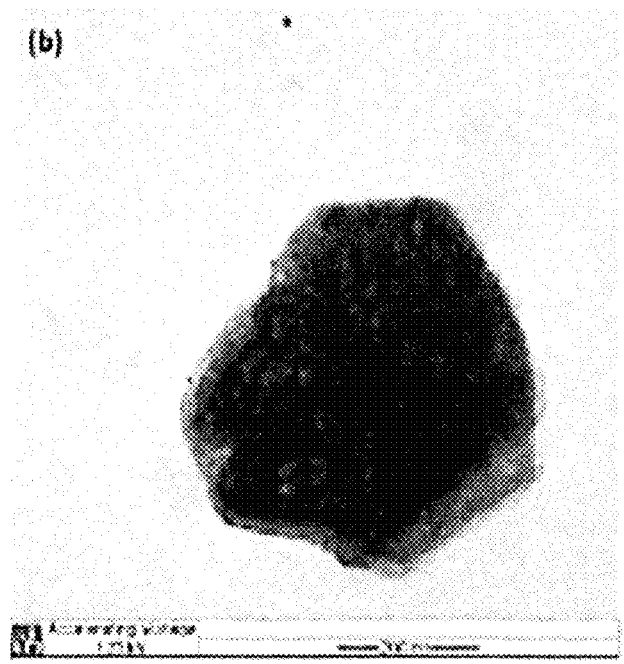
Figure 2C:
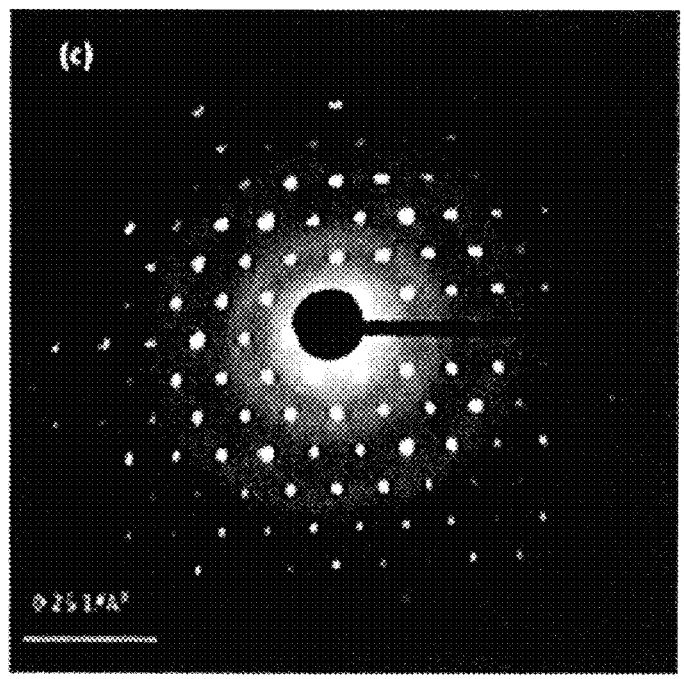
Figure 2D:
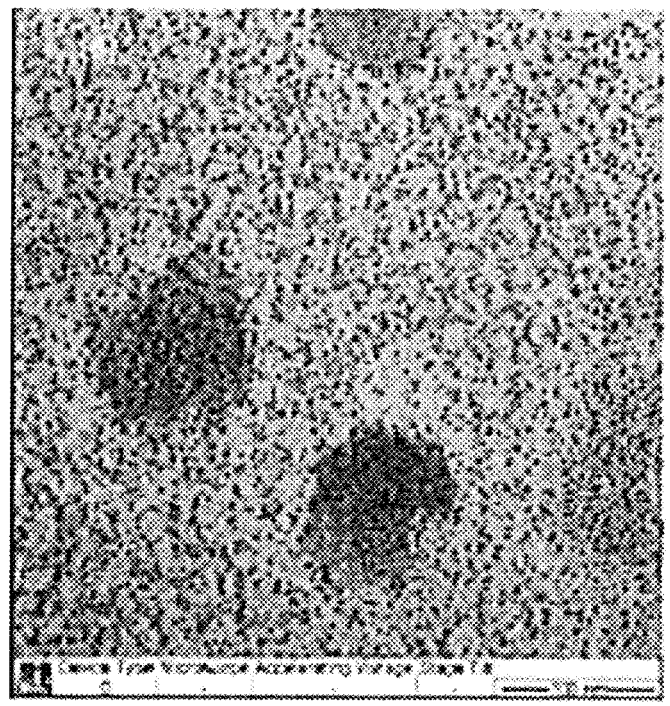

In an exemplary embodiment, initial self-assembly studies were conducted using two different metal-ion conjugated PL derivatives, i.e. $Cu^{+2}$-PL and $Ni^{+2}$-PL, along with a control, which was a blend of metal ion precursor (copper acetate) and a non-metal chelated PL (DPPC). The chemical structures and the chemistry of the self-assembly process are depicted in FIG. 1.

The assembly process was based on a solvent polarity-driven method where the metal ion chelated PL derivative was dissolved in a polar organic solvent ("good solvent" for solubility), maintaining at a specific concentration, (1 mg/mL) and followed by drop feeding slowly into another solvent (a "bad solvent" for solubility). In some embodiments, chloroform is used as a "good solvent" and water as a "bad solvent". The slow drop feeding of metal ion chelated PL solution (either $Cu^{+2}$-PL or $Ni^{+2}$-PL) into the water drives the formation of micelles and/or vesicles. While not intending to be bound by theory, it is believed that during the vesicles' formation, metal ions chelated hydrophilic heads are self-assembled to form the core of vesicles and hydrophobic tails are arranged to form the vesicles walls. This phenomenon is defined as an inverse vesicle (or micelle) formation, which occurs when hydrophobic chains radiate away from centrally aggregated headgroups that surround water molecules. This inverse aggregation is common in isotropic and thermodynamically stable ternary systems such as microemulsions, where two immiscible phases, like water and "oil", are present. As described herein, in some embodiments, the two phases are water and chloroform. It was evident that the driving force for the formation of metal cations entrapped vesicles could be due to the polarity difference of two solvents, e.g., in this case an oil-in-water model.

Vesicles are commonly observed in natural and synthetic PLs when phospholipids are dispersed in water. In water solution they tend to aggregate spontaneously to form bilayers, which resemble the types of structures they form in biological membranes. Bilayer vesicles are generally metastable structures in aqueous solution and, depending on the conditions of preparation (i.e., stirring, sonication, and extrusion), some energy is required to dissolve the PLs in water and to induce self-aggregation. The oil-in-water strategy accelerates the self-aggregation process resulting in inverse vesicles. In some embodiments, the produced vesicles comprise an average size ranging from 10 nm to 10 µm, and in some instances can contain one (unilamellar) or more (multilamellar) concentric bilayer surfaces in onion-like structures (hydrated multilayers). By examining the reaction mixture at each stage of the self-assembly process under transmission electron microscope (TEM), unilamellar and multilamellar vesicles were observed having an inverse micelle formation where metal ions encapsulation by polar heads forms the vesicle core. As can be seen in FIG. 2A-2D, an unaged vesicle's core is dark, which indicates accumulated metal ions, and its periphery is light, which corresponds to clear vesicle walls consisting of hydrophobic tails of self-assembled lipid bilayers. This clear difference in the unaged vesicle's contrast confirms that the metal ions are being incorporated into the PL bilayer. The average size distribution of vesicles ranges from 10 nm (smallest) to up to 150 nm (largest vesicles).

Figure 3A:
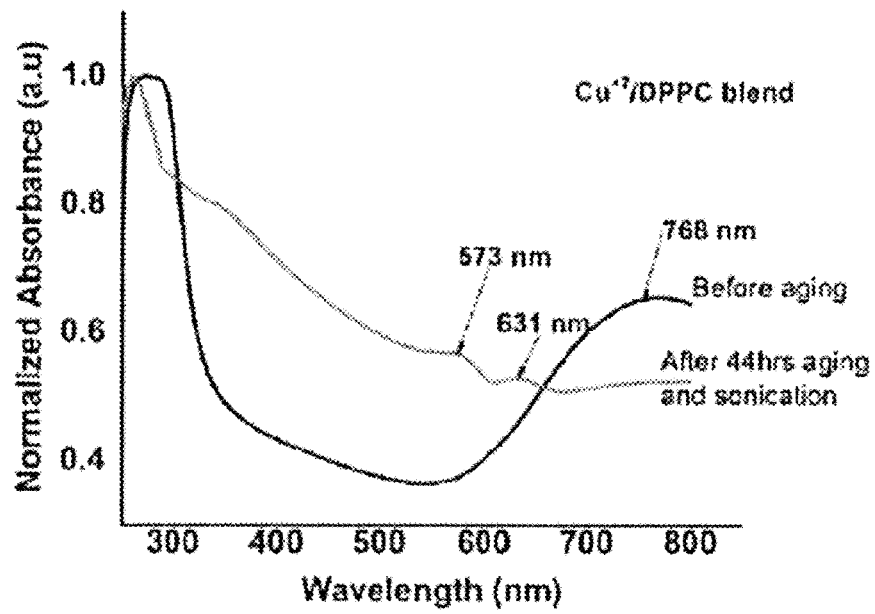
FIG. 3A is UV-vis spectrum of $Cu^{+2}$ ion/DPPC blend.
Figure 3B:
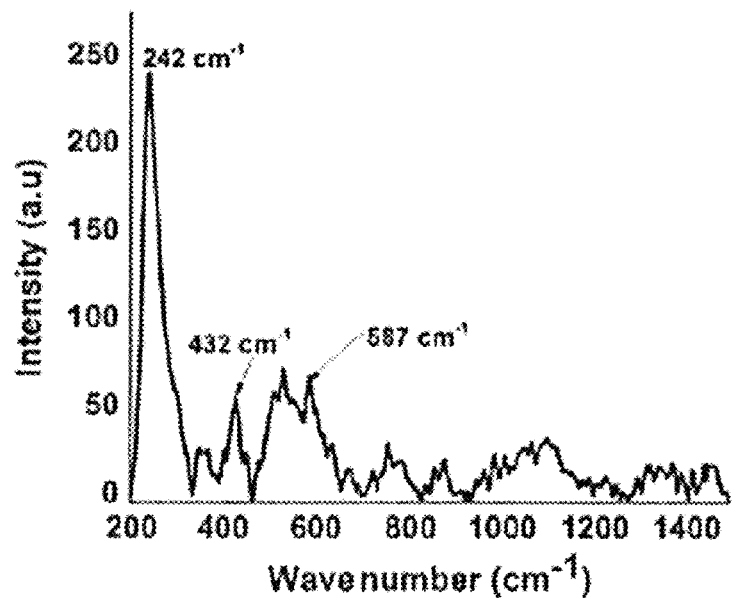
FIG. 3B is a Raman spectrum of $Cu^{+2}$ ion/DPPC blend.
Figure 3C:
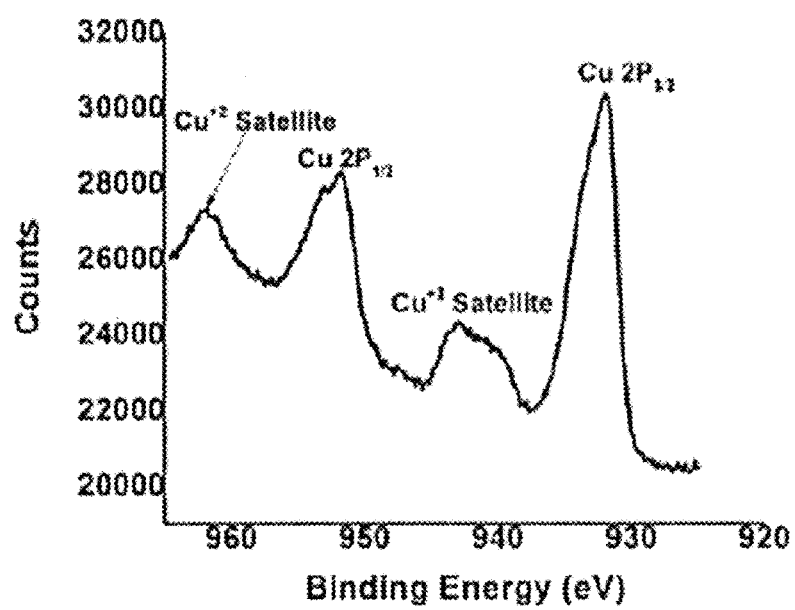
FIG. 3C is an XPS spectrum of self-assembled $Cu^{+2}$-PL.

Upon subjecting the solution mixture of metal-ion chelated PL vesicles to aging at 0° C. under different time intervals, samples were analyzed using TEM, selective area diffraction, X-ray photoelectron spectroscopy (XPS), Raman spectroscopy, and UV-visible spectroscopy. These analyses revealed that metal-ion cations are indeed reacted to form metal oxides during the aging and are ripened to form nanocrystals, which were in the size range of 1 to 3 nm with homoegenous size distribution. For example, in the case of $Cu^{+2}$-PL self-assembly process, the presence of Cu—O stretching peaks at 242, 362, and 432-587 nm in the Raman spectrum, and the presence of binding energy peaks corresponding to the typical $Cu^{+2}$ oxidation state (with respect to Cu $2P_{3/2}$ and Cu2 $P_{1/2}$ spin-orbit states) at 934.0 eV and 954.0 eV in the XPS spectrum support the formation of metal oxide nanocrystals. More over the peak shift in the UV-visible spectrum from 730 nm ($Cu^{+2}$ metal ion) to 572-582 nm also confirms the in-situ formation of copper oxides nanocrystals (FIG. 3A-3C). Thus, it was confirmed that metal cations convert to metal oxide nanocrystals by the solution medium with both type of PL derivatives ($Cu^{+2}$-PL and $Cu^{+2}$/DPPC blend).

Following the similar self-assembly process with a blend of DPPC and copper acetate precursor in water: chloroform solvent mixture, highly crystalline irregular and spherical shaped vesicles were prepared that are filled with metal oxide nanocrystals. In the control reaction (i.e. $Cu^{+2}$/DPPC in chloroform solution), homogeneously distributed copper oxide nanoparticles were prepared upon aging. Copper oxide nanocrystals formation was also observed to accelerate upon aging followed by the probe sonication. These results suggest that PLs medium as well as sonication catalyze the conversion of chelated metal ion to metal oxide nanocrystals. Prior literature evidences metal oxide nanocrystals formation in an emulsion medium at cold temperature either in the presence of amine chelated compounds (microemulsion method), or from ultra-sonication method (sonochemical method).

Figure 4A:
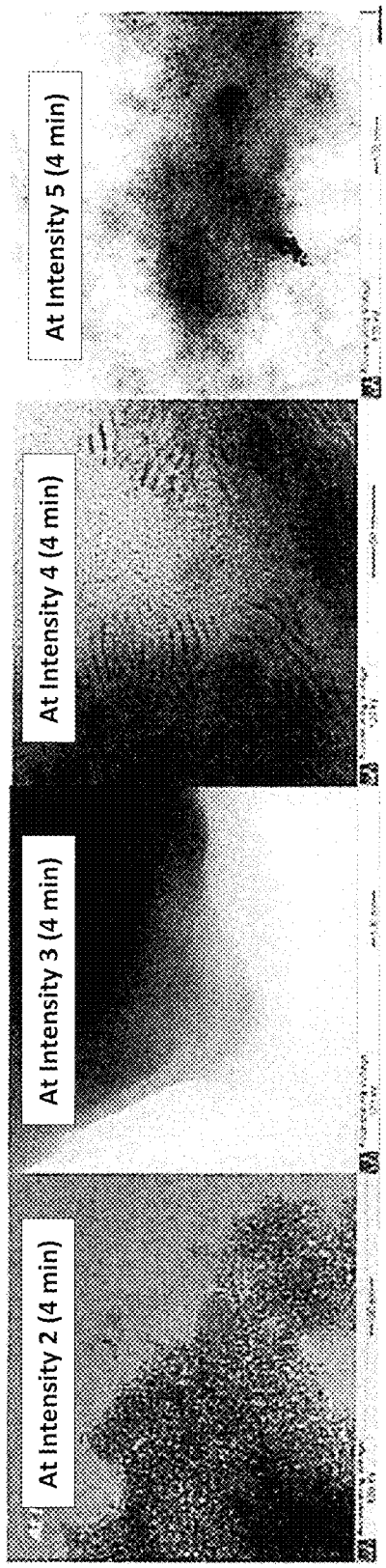
FIG. 4A is a series of TEM images of nanoassemblies formed from $Cu^{+2}$-PL at different sonication intensities.
Figure 4B:
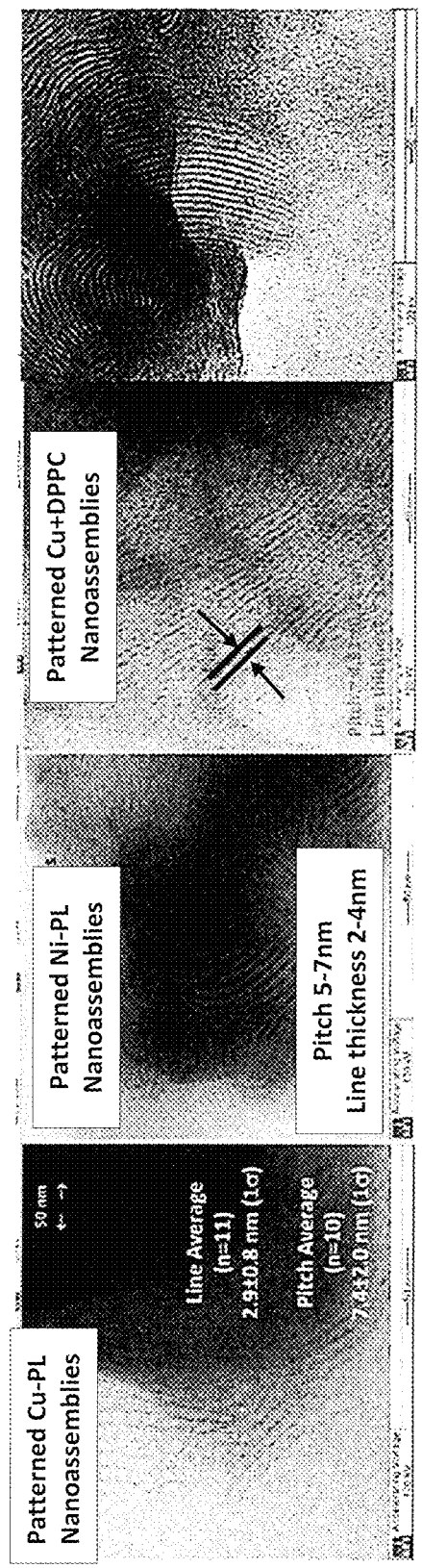
FIG. 4B is a series of TEM images of patterned assemblies of metal/metal oxide conjugated (phospholipids) PLs.

In some embodiments, lamellar metal oxide decorated lipid structures were prepared. The formation of lamellar metal oxide decorated lipid structures, a key enabling step to achieve sub 4 nm random patterns, was established using a probe sonication method. Samples, aged for specific lengths of time, were sonicated at different intensities and different time intervals while maintaining the temperature of the medium at 10° C. Synthetic parameters such as sonication intensity and time, solution temperature, and aging time before and after sonication were evaluated to optimize the self-assembly of the lamellar structures of metal-conjugated lipid bilayers into atomic scale patterns. While not intending to be limited to theory, it is believed that sonication leads to vesicle rupture and re-assembly to form lamella structures of lipid bilayers, the latter being governed by additional assembly parameters. FIG. 4A represents images of assemblies visualized under TEM after probe sonication at each intensity. In some cases, samples aged 44 hours and subjected to sonication at intensity rate of three for four minutes gave atomic scale random line patterns. As shown in FIG. 4B, the metal oxide chelated head groups are represented by darker lines. It is believed that sonication power provided the necessary thermodynamic energy to enhance the formation and local concentration of additional metal oxide-head groups conjugates and drive the formation of the observed embedded ~3 nm lamellar structures. In some cases, well-ordered lines were observed at certain sonication intensities, so in some embodiments, a dynamic and thermodynamically driven self-assembly process guides the formation of lamellar structures in these bioinspired molecular conjugates. In some instances, each $M^{+2}$ cation coordinates with two carboxylate anions on the head group of a given amphiphilic molecule such as a phospholipid or multicarboxylated fatty acid.

Figure 5A:
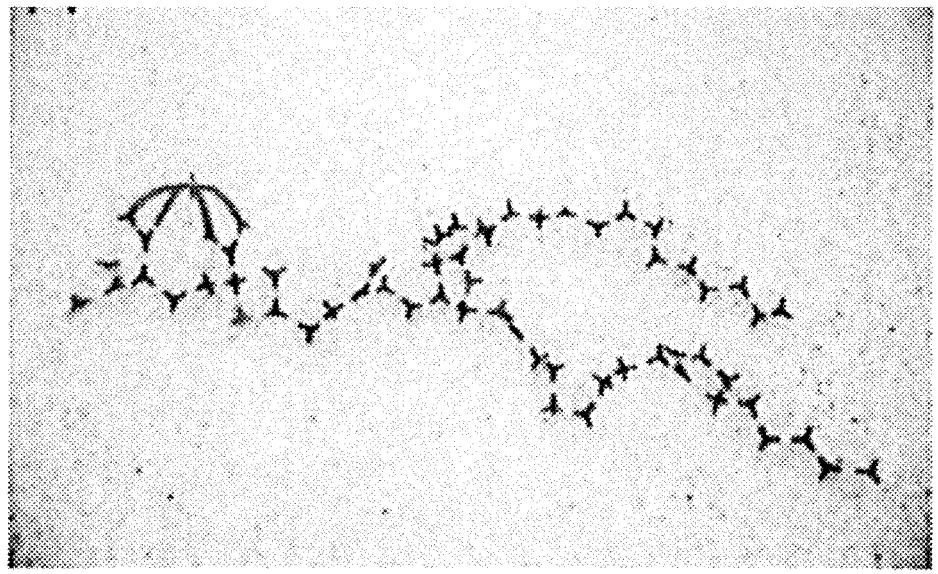
FIG. 5A is a molecular model of a metal cat ion ($M^{2+}$), silver, coordinated (blue) with two carboxylate anions, depicted by the red oxygens, in the PL-analog conjugate.
Figure 5B:
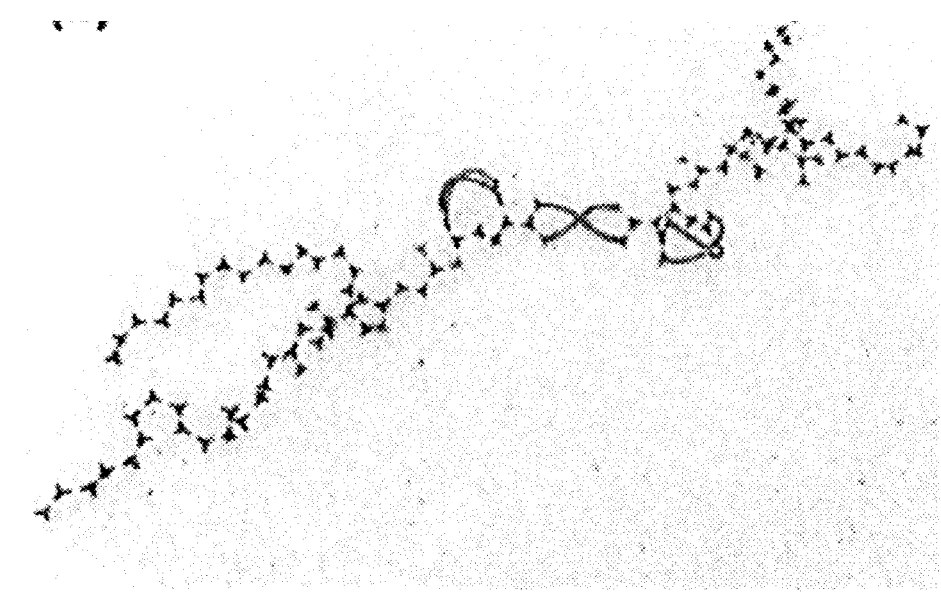
FIG. 5B is a molecular model of two metal-molecule conjugates linked through the addition of an additional metal cation, which coordinates with additional carboxylate an ions on conjugate.
Figure 5C:
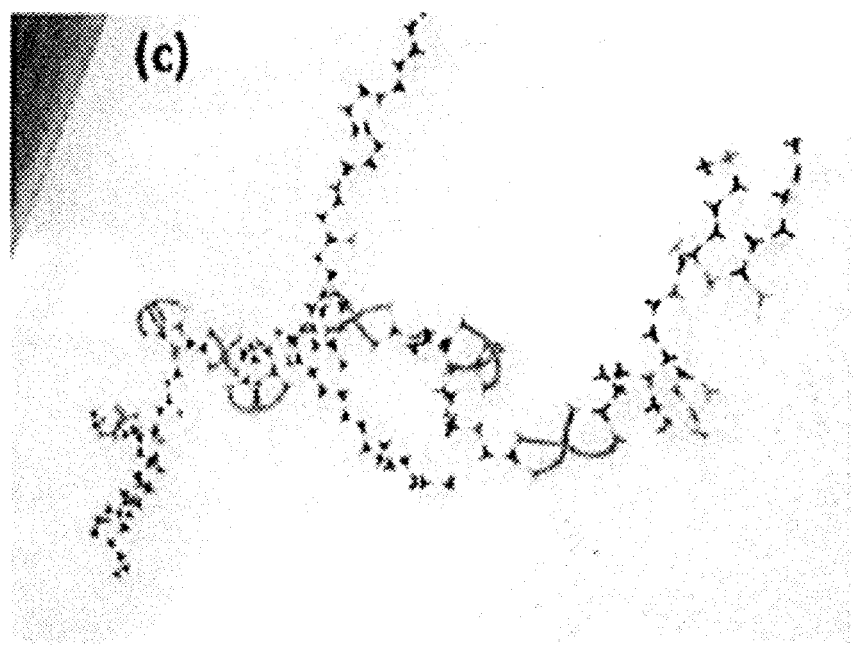
FIG. 5C is a molecular model of several metal-molecule conjugates linked via additional metal cation complexes with available head groups an ions.

FIG. 5A is a molecular model of a metal cat ion ($M^{2+}$), silver, coordinated (blue) with two carboxylate anions, depicted by the red oxygens, in the PL-analog conjugate. Again, while not intending to be bound by theory, it is believed that during aging and/or sonication, metal cations can move and reform coordination complexes with other head groups. Two possible example of a new coordinated complex formed by a migrating metal cation is shown in FIG. 5B. This dynamic reassembly of coordination complexes requires the release and migration of a metal cation from another metal-molecule conjugate during aging and/or sonication. Notably, the formation of this metal cation linkage between two molecular metal conjugated systems represents an increased concentration of the net metal character of the head groups and a dilution of metal character in the amphiphilic molecule from which it came. Since the differences in the opposing amphiphilic moieties in the metal-molecule conjugate system drive its self-assembling behavior, migration of the metal cation to coordinate with and form linkages with other head groups appears to change the internal segregation energy between the polar head and nonpolar tail groups. In this way, the formation and concentration of metal coordination within and between polar head groups serves as a mechanism for achieving an internal dynamic x, which is static in traditional block copolymer self-assembly. This migration and reformation of metal coordinated conjugates may also assist in explaining the formation of the observed self-assembled metal/metal oxide nanowires, as conveyed in FIG. 5C.

As described herein, both metal ion-chelated phospholipids and non-metal ion-chelated phospholipids (blends of metal ions with DPPC) can lead to an effective supramolecular synthetic route for designing and fabricating nanoscale assemblies of metal oxide conjugated phospholipids, with near atomic scale precision. Compositions and methods described herein can in some instances provide bioinspired molecules and nanomaterials having atomic scale geometric platforms and high-density functionality, and these composition and methods can provide geometric, functional and 3D patterning and diversification in nanomaterial formation.

Some embodiments described herein are further illustrated in the following non-limiting examples.

EXAMPLE 1

Self-Assembly of Cu Chelated Phospholipids ($Cu^{+2}$-PL): Solvent Polarity Driven Method 1,2-dimyristoyl-sn-glycero-3-phosphoethanolamine-N-diethylenetriaminepentaacetic acid (copper salt) (PEDTPA (Cu), $Cu^{+2}$-PL) was purchased from Avanti Polar Lipids. Chloroform ($CHCl_3$) was purchased from SigmaAldrich. Unless otherwise specified, all chemicals were used as received.

$Cu^{+2}$-PL (1 mg) was added to $CHCl_3$ solution (2 ml) to make the 0.5 mg/ml of $Cu^{+2}$-PL standard solution. An aliquot (0.5 ml) from the standard solution was added slowly through the walls into nanopore distilled water (1 ml) and kept 25 hours in the refrigerator for aging. After aging, the solution was probe sonicated at intensity 3 for 4 minutes in an ice bath. Then it was kept in the refrigerator for aging at 22, 44, and 66 hours followed by each sample was sonicated at intensity of 3 for 4 minutes in an ice bath. The self-assembly process at each step was monitored by imaging the samples using transmission electron microscopy (TEM) and UV-visible spectroscopy. Immediately after the probe sonication, grids were prepared, and same drying conditions of all grids were maintained.

EXAMPLE 2

Cu Chelated Phospholipids ($Cu^{+2}$-PL): Intensive Study

A series of samples were prepared as described in EXAMPLE 1, and kept 25 hours in the refrigerator for aging. Each of the samples were probe sonicated at four different intensities (Intensity at 2, 3, 4, and 5) for 4 minutes in an ice bath. Immediately after the probe sonication, one drop of solution was drop casted on carbon coated grid and dried one hour inside the hood.

Images of thin film nanoassemblies were acquired using a transmission electron microscope (a Carl Zeiss Libra120 TEM) operated at an accelerating voltage of 120 kV. The Raman spectrum were obtained using the XploRATM Raman microscope equipped with a 532 nm laser for sample excitation. UV-vis spectrophotometer (Agilent 6000i) was used to monitor the formation of copper oxide-PL conjugates with respect to aging time intervals. XPS spectrum was obtained using Thermo Scientific Esca lab Xi+ (XPS/UPS/ISS/REE LS) for drop casted thin film on glass substrate. The solution was spin coated on cleaned ITO substrate and conductive AFM (Bruker's MultiMode 8-HR) was conducted.

The invention claimed is:
1. A hybrid nanomaterial composition comprising:
   an amphiphilic molecule comprising a polar head and a lipophilic tail; and
   a metal or metal oxide conjugated to the polar head of the amphiphilic molecule, wherein the amphiphilic molecule comprises one or both of a phospholipid, a multicarboxylated fatty acid, or any derivative thereof, and wherein the metal is copper or nickel.
2. The composition of claim 1, wherein the amphiphilic molecule has photopolymerizable side chains.
3. The composition of claim 1, wherein the metal is an $M^{2+}$ cation.

4. The composition of claim 1, wherein the composition self assembles to form line and/or space patterns of 10 nm, 8 nm, 6 nm, 5 nm, 4 nm, 3 nm, 2 nm, 1 nm, or less than 1 nm.

5. The composition of claim 1, wherein the composition assembles into atomic scale random patterns on solid substrates, the patterns comprising conductive metal oxide or metal nodes decorated on lamellar structures of lipid bilayers.

6. A method of fabricating a self-assembled functional nanostructure comprising:
dissolving a composition according to claim 1 in a first solvent to form a solubilized component; and
mixing the solubilized component into a second solvent, wherein the composition is soluble in the first solvent and insoluble in the second solvent.

7. The method of claim 6, wherein the self-assembled functional nanostructure comprises an inverse vesicle or micelle.

8. The method of claim 6, further comprising sonicating the solubilized component when mixing into the second solvent.

9. The method of claim 6, wherein mixing the solubilized component into the second solvent is performed at approximately room temperature.

10. The method of claim 6, wherein the self-assembled functional nanostructure self assembles as the solubilized component is mixed into the second solvent.

11. The method of claim 6, wherein the self-assembled functional nanostructure is a nanowire.

* * * * *